United States Patent [19]
Budmiger

[11] Patent Number: 5,323,156
[45] Date of Patent: Jun. 21, 1994

[54] DELTA-SIGMA ANALOG-TO-DIGITAL CONVERTER

[75] Inventor: Thomas Budmiger, Ettingen, Switzerland

[73] Assignee: Endress+Hauser Flowtec AG, Switzerland

[21] Appl. No.: 967,508

[22] Filed: Oct. 28, 1992

[30] Foreign Application Priority Data

Nov. 13, 1991 [EP] European Pat. Off. ......... 91810875.4

[51] Int. Cl.$^5$ .............................................. H03M 3/02
[52] U.S. Cl. ...................... 341/143; 341/118
[58] Field of Search ......................... 341/118, 143, 166

[56] References Cited

U.S. PATENT DOCUMENTS

| | | | |
|---|---|---|---|
| 3,956,700 | 5/1976 | Condon | 341/143 |
| 4,573,037 | 2/1986 | Robinton et al. | 341/129 |
| 4,926,178 | 5/1990 | Mallinson | 341/143 |

Primary Examiner—Marc S. Hoff
Attorney, Agent, or Firm—Barnes & Thornburg

[57] ABSTRACT

An apparatus is provided to avoid linearity errors caused by switching at different frequencies. The apparatus includes an integrator whose signal input is supplied through an integrating resistor with an analog signal; a comparator having its comparator input connected to the integrator output and its reference input grounded; a pulse-width selector providing a narrow or wide pulse depending comparator output, whose signal is connected to the comparator output, and whose first clock and second inputs are supplied with a clock signal and an additional clock signal derived from said clock signal by frequency division (divisor n>3); series combined first and second electronic switches which are connected between a unipolar reference voltage and ground or between the two terminals for a bipolar, balanced-to-ground reference voltage, with the control inputs of the electronic switches connected to the non-inverted and inverted outputs, respectively, of the pulse-width selector, and with the junction of the electronic switches connected to a further-processing arrangement and through a feedback resistor to the signal input of the integrator. The reference input is, in the case of the unipolar reference voltage, fed with that portion of this voltage which is equal to [Ri/(Ri+Rk)] Uu/2, or, in the case of the bipolar reference voltage, connected to ground. The width of the narrow pulse is equal to the period of the clock signal, while the width of the wide pulse is equal to (n−1) times the period of the clock signal.

3 Claims, 4 Drawing Sheets

DELTA-SIGMA ANALOG-TO-DIGITAL CONVERTER

BACKGROUND OF THE INVENTION

The present invention relates to delta-sigma analog-to-digital converters.

The simplest circuit of a delta-sigma analog-to-digital converter comparable with the subject matter of the invention according to claim 1 is described in the journal "rme", 1978, page 024.

That basic circuit consists of: an integrator, namely a simple RC section; a comparator whose comparator input is supplied with an analog signal to be converted, and whose reference input is connected to the junction of the resistor and capacitor of the integrator; a D flip-flop having its D input connected to the output of the comparator, and whose clock input is supplied with a clock signal; a series combination of a first and a second electronic switch connected between the reference voltage and ground wherein the control inputs of the first and second electronic switches are connected to the non-inverted and inverted outputs, respectively, of the D flip-flop, and wherein the junction of the electronic switches is coupled to the signal input of the integrator through the resistor of the RC section; and a further-processing arrangement having its input connected to the noninverted output of the D flip-flop.

The simplest circuit of a delta-sigma analog-to-digital converter comparable with the subject matter of the invention according to claim 2 is described in U.S. Pat No. -A-3,955,191.

According to FIG. 5 of U.S. Pat. No. -A-3,955,191, this basic circuit comprises an RC section as an integrator to which an analog signal to be converted is applied through the integrating resistor, and a D flip-flop whose D input is connected to the junction of the resistor and capacitor of the integrator, and whose clock input is supplied with a clock signal, and whose inverted output is fed back to said junction through an additional resistor, which junction is also connected to a reference voltage.

If, as shown in FIG. 7 of U.S. Pat No. -A-3,955,191, an operational amplifier is inserted between the analog-signal input and the integrator such that its first input is supplied with the analog signal and its second input is grounded, the inverted output of the D flip-flop may be additionally fed back to that first input through a T-section consisting of two resistors and a capacitor.

An essential feature of the simple delta-sigma analog-to-digital converter described in the above journal "rme" is that the number of polarity reversals occurring at the output of the comparator per unit of time, i.e., their frequency, depends on the amplitude of the analog signal to be converted: This frequency is exactly one-half that of the clock signal if the amplitude of the analog signal is equal to one-half of the reference voltage, and decreases from this value toward both smaller and larger amplitudes proportionally to the amplitude, of the explanation of FIG. 5 below.

Particularly with high-frequency clock signals, the switching times of the electronic switches or of the output transistors of the D flip-flop, which are variable due to the variable frequency of the polarity reversals, cause considerable linearity errors, so that the attainable accuracy of the conventional delta-sigma analog-to-digital converter is quite limited. In addition, these switching times are strongly temperature-dependent, which contributes to the linearity error but is practically noncompensable.

The invention serves to solve this problem.

SUMMARY OF THE INVENTION

The present invention consists in a delta-sigma analog-to-digital converter comprising an integrator whose signal input is supplied through an integrating resistor with an analog signal to be converted, a comparator having its comparator input connected to the output of the integrator and its reference input grounded, a pulse-width selector which provides a narrow or wide pulse depending on the level of the comparator output signal, whose signal input is connected to the output of the comparator, and whose first clock input is supplied with a clock signal and whose second clock input is supplied with an additional clock signal derived from said clock signal by frequency division (divisor n>3), and a series combination of a first and a second electronic switch which is connected either between a unipolar reference voltage and ground or between the two terminals for a bipolar, balanced-to-ground reference voltage, with the control inputs of the first and second electronic switches connected to the noninverted and inverted outputs, respectively, of the pulse-width selector, and with the junction of the electronic switches connected to a further-processing arrangement and through a feedback resistor to the signal input of the integrator, wherein the reference input is, in the case of the unipolar reference voltage, fed with that portion of this voltage which is equal to $[R_i/(R_i+R_k)] U_u/2$, or, in the case of the bipolar reference voltage, connected to ground, and wherein the width of the narrow pulse provided by the pulse-width selector is equal to the period of the clock signal, while the width of the wide pulse provided by the pulse-width selector is equal to $(n-1)$ times the period of the clock signal, $R_i$ and $R_k$ being the values of said integrating resistor and said feedback resistor respectively and $U_u$ being the value of said reference voltage.

The invention further consists in a delta-sigma analog-to-digital converter comprising an integrator whose signal input is supplied through an integrating resistor with an analog signal to be converted, a comparator having its comparator input connected to the output of the integrator and its reference input grounded, a pulse selector which provides a narrow or wide pulse depending on the level of the comparator output signal, whose signal input is connected to the output of the comparator and whose first clock input is supplied with a clock signal and whose second clock input is supplied with an additional clock signal derived from said clock signal by frequency division (divisor n>3), and a D flip-flop whose D input is connected to the output of the pulse-width selector, and whose noninverted output is coupled through a feedback resistor to the input of the integrator, and whose clock input is supplied with the additional clock signal, and whose inverted output is coupled to a further-processing arrangement, and whose operating voltage is either a unipolar reference voltage or a bipolar reference voltage balanced with respect to ground, wherein the reference input is, in the case of the unipolar reference voltage, fed with that portion of this voltage which is equal to $[R_i/(R_i+R_k)] U_u/2$, or, in the case of the bipolar reference voltage, connected to ground, and wherein the width of the narrow pulse provided by the pulse-width selector is equal to the period of the clock signal, while the width of the wide pulse provided by the pulse-width. selector is equal to (n−1) times the period of the clock signal, Ri and Rk being the values of said integrating resistor and said feedback resistor, respectively, and Uu being the value of said reference voltage.

Because of the pulse-width selector inserted between the comparator and the series combination of the two switches or between the comparator and the D flip-flop, the frequency of the polarity reversals at the output of the comparator is constant over the entire amplitude range of the analog signal, so that practically ideal linearity can be achieved, which is also temperature-independent.

As a residual error, only a temperature dependence of the gain and the offset remains; the former can be measured and compensated, e.g., arithmetically by means of a microprocessor, while the latter can be easily eliminated by taking the difference of the output signals of the delta-sigma analog-to-digital converter.

BRIEF DESCRIPTION OF THE DRAWINGS

The four variants of the invention will now be explained in greater detail with reference to the accompanying drawings, in which like parts are designated by like reference characters, and in which.

DETAIL DESCRIPTION OF THE INVENTION

Figure 1:
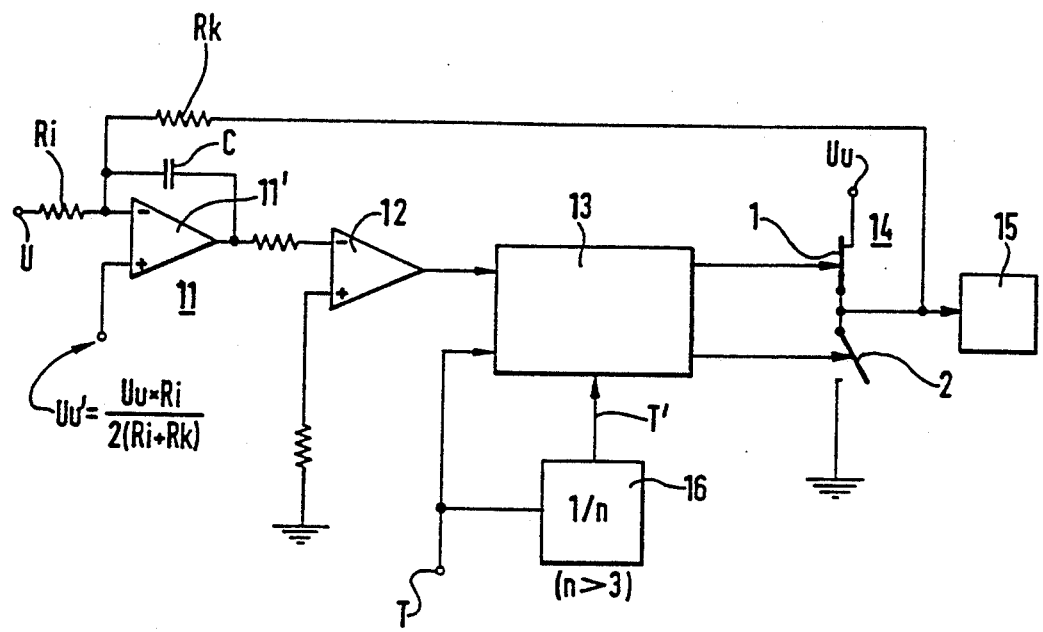
FIG. 1 is a block diagram of an embodiment of the first variant of the invention.

In the delta-sigma analog-to-digital converter of FIG. 1, an analog signal U to be converted from analog to digital form is applied through an integrating resistor Ri to a signal input of an integrator 11. In the embodiment of FIG. 1, the integrator 11 contains a capacitor C and an operational amplifier 11' having the capacitor suitably connected thereto.

The output of the integrator 11 is coupled to the comparator input of a comparator 12, which is preferably implemented with an additional operational amplifier. The reference input of the comparator is grounded.

The output of the comparator is coupled to the signal input of a pulse-width selector 13, whose first clock input is supplied with a clock signal T, which controls the analog-to-digital conversion. The second clock input of the pulse-width selector is supplied with an additional clock signal T' derived from the first clock signal by frequency division (divisor n>3) in the frequency divider 16. Depending on the level of the output signal from the comparator 12, the pulse-width selector 13 produces a narrow pulse, whose width is equal to the period of the clock signal T, or a wide pulse, whose width is equal to (n−1) times the period of the clock signal T.

A series combination 14 of a first and a second electronic switch is connected between a unipolar reference voltage Uu and ground. The control input of the first electronic switch 1 is coupled to the uninverted output of the pulse-width selector 13, and that of the second electronic switch 2 to the inverted output. The junction of the electronic switches 1, 2 is connected through a feedback resistor Rk to the signal input of the integrator 11. Also connected to this junction is a further-processing arrangement 15. The reference input of the integrator 11 is fed with that portion of the unipolar reference voltage Uu which is equal to [Ri/(Ri+Rk)] Uu/2.

The two electronic switches 1, 2 can be implemented with bipolar transistors or field-effect transistors, particularly with insulated-gate field-effect transistors, preferably of the enhancement type.

Figure 2:
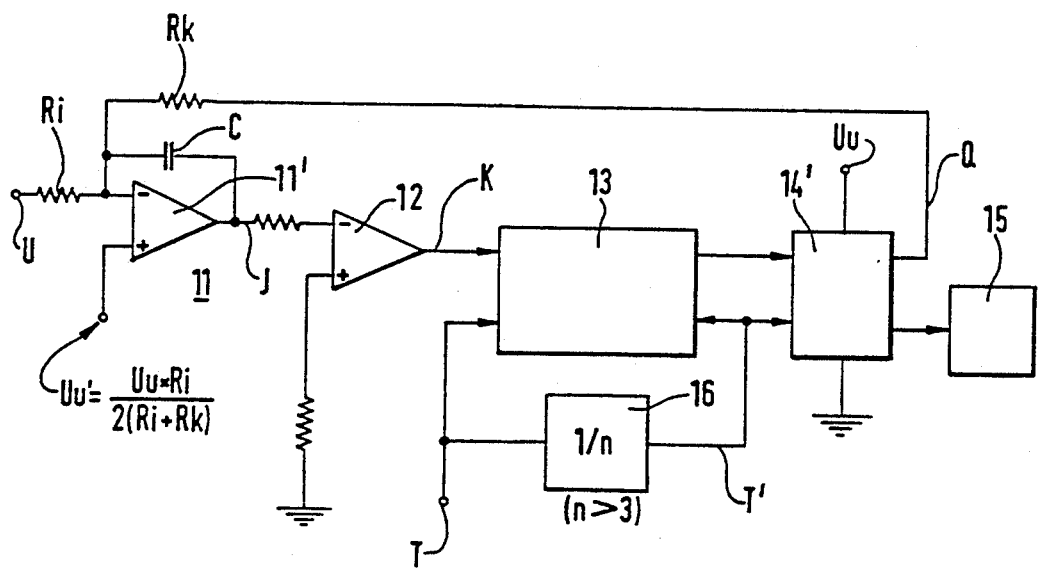
FIG. 2 is a block diagram of an embodiment of the second variant of the invention.

The delta-sigma analog-to-digital converter of FIG. 2 differs from that of FIG. 1 in that the series combination 14 has been replaced with a D flip-flop 14'. The supply voltage for the D flip-flop is the unipolar reference voltage Uu, and its clock input is supplied with the additional clock signal T'.

Figure 3:
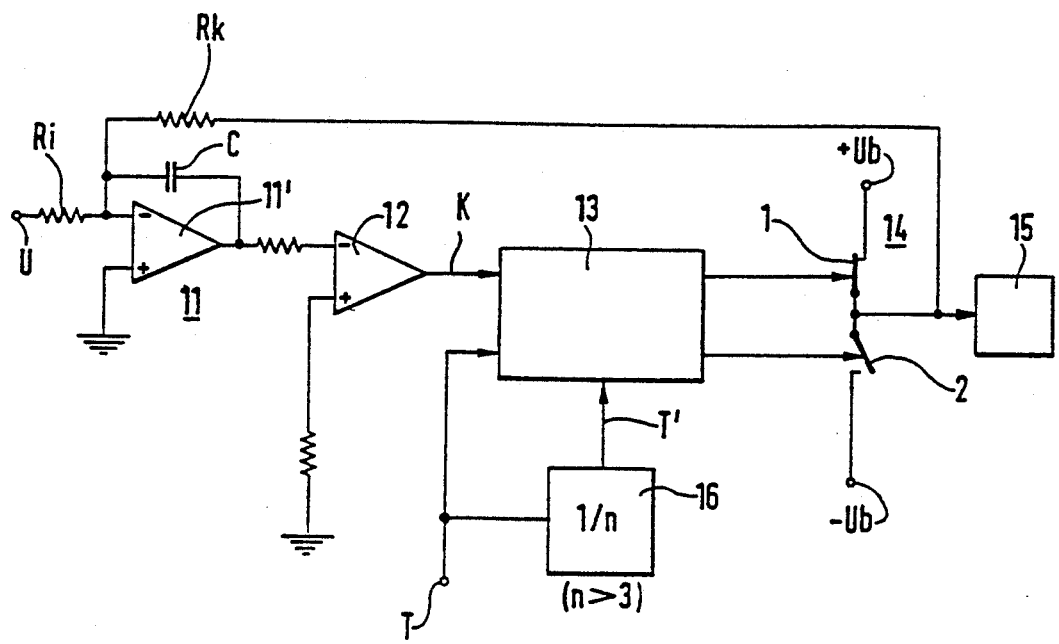
FIG. 3 is a block diagram of an embodiment of the third variant of the invention.

In the delta-sigma analog-to-digital converter of FIG. 3, the series combination 14 is connected to the two terminals for a bipolar, balanced-to-ground reference voltage Ub, the two terminals being designated +Ub and −Ub. Therefore, the reference input of the integrator 11 is grounded. Otherwise, the construction of the circuit of FIG. 3 is identical to that of FIG. 1.

Figure 4:
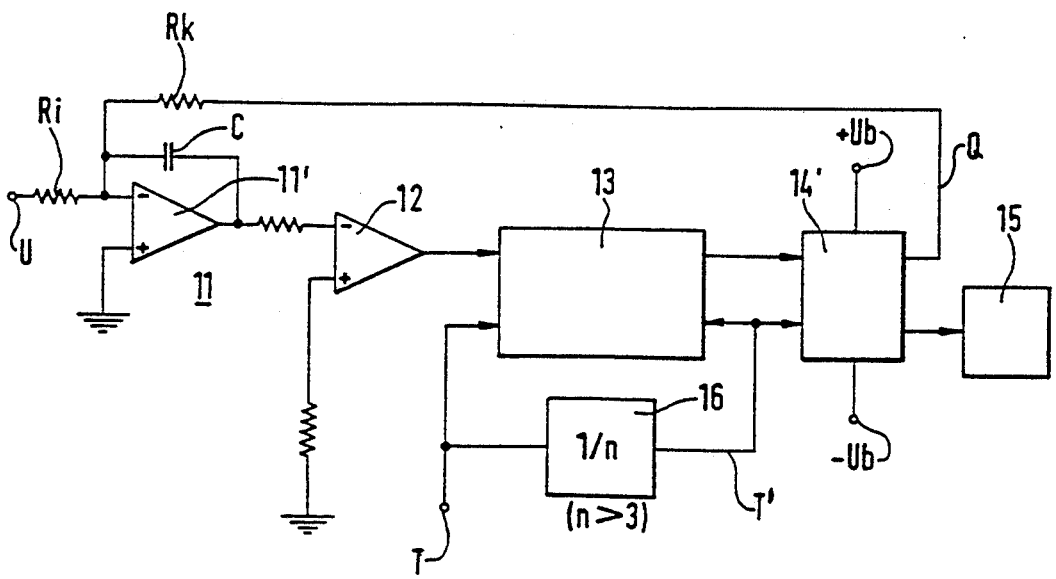
FIG. 4 is a block diagram of an embodiment of the fourth variant of the invention.

In the delta-sigma analog-to-digital converter of FIG. 4, the D flip-flop 14' is connected to the two terminals for the bipolar, balanced-to-ground reference voltage Ub. Therefore, the reference input of the integrator 11 is grounded, as in FIG. 3. Otherwise, the construction of the circuit of FIG. 4 is identical to that of FIG. 2.

In a preferred embodiment of the invention, the number n by which the frequency divider divides is a power of two; accordingly, n is at least equal to 4. The frequency divider 16 can thus be a simple binary divider.

Figure 5:
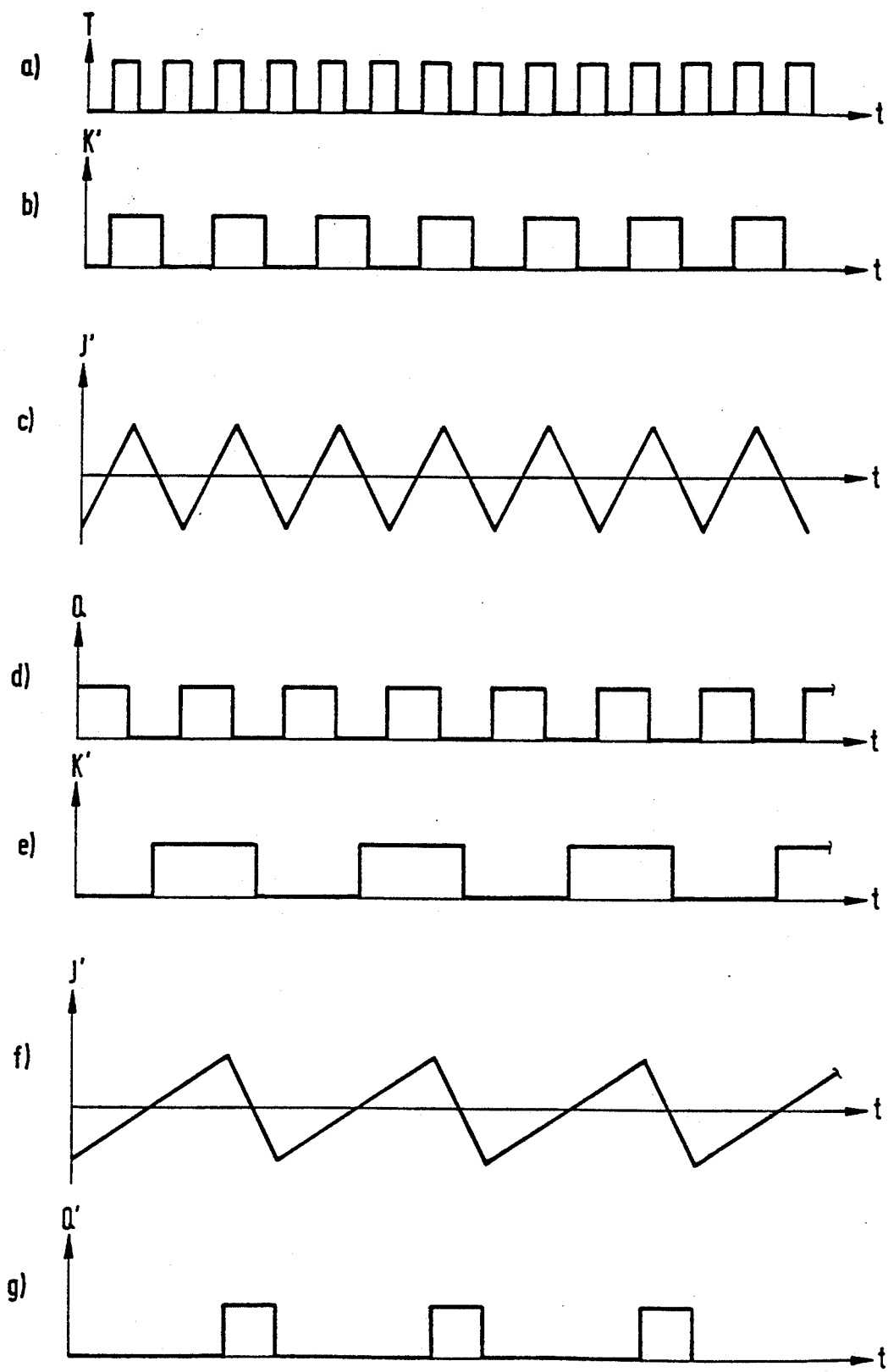
FIG. 5a –5g shows various waveforms occurring in a prior art circuit at two different amplitudes of the voltage to be converted.
Figure 6:
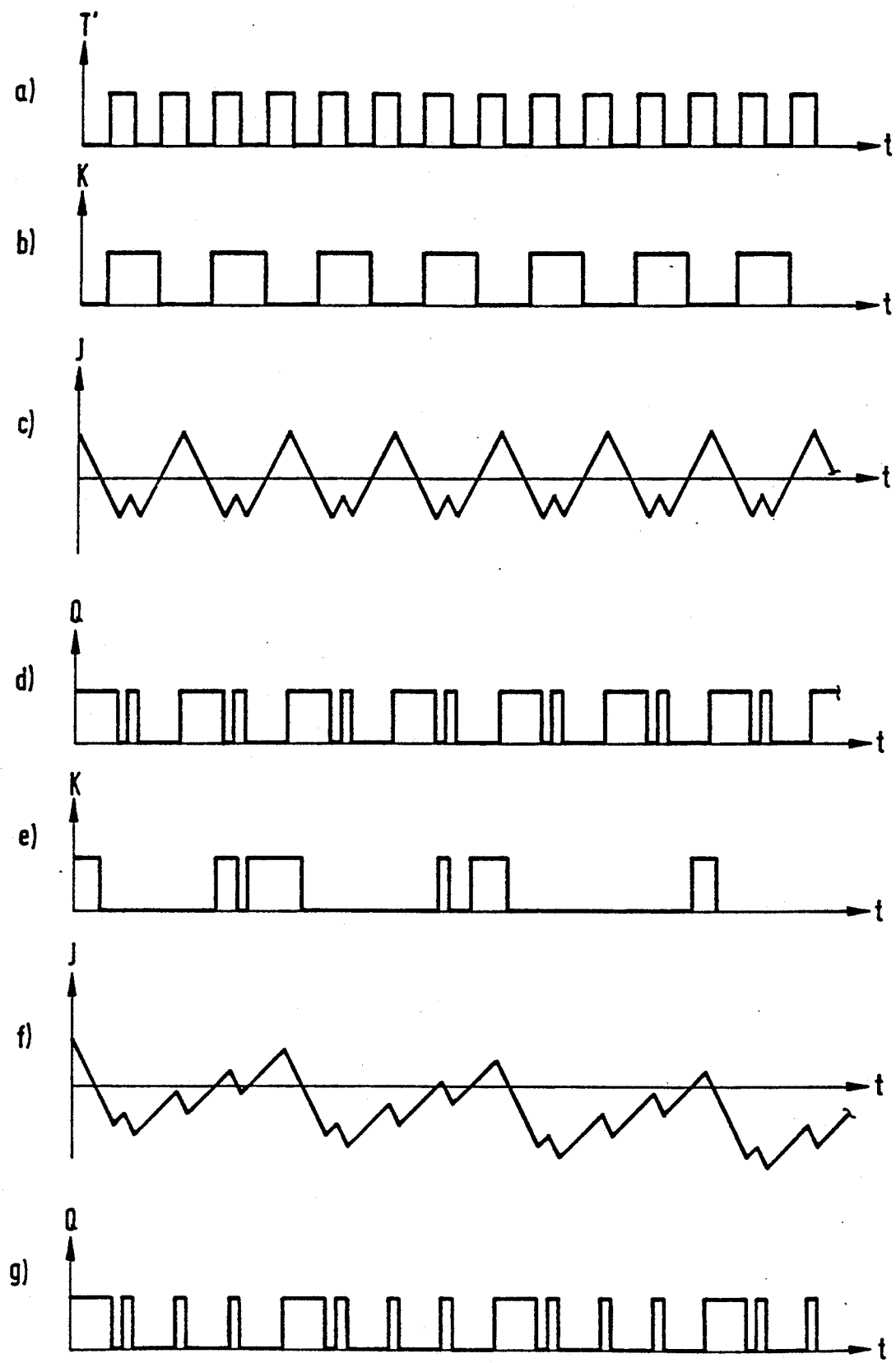
FIG. 6a –6g shows various waveforms occurring in the circuit of FIG. 2 at two different amplitudes of the voltage to be converted.

FIGS. 5 and 6 serve to explain the operation of the invention. FIG. 5 relates to an arrangement as described in the above-mentioned journal "rme", i.e., to a circuit as shown in FIG. 2, but without the pulse-width selector 13 and the frequency divider 16.

The seven graphs a) to g) of FIG. 5 are the waveforms of the following signals:

a): clock signal T;
b) and e): output signal K' of the comparator;
c) and f): output signal J' of the integrator;
d) and g): output signal Q' of the D flip-flop.
The following holds
for b) to d): analog signal equal to ½ of the reference voltage, and
for e) to g): analog signal equal to ¾ of the reference voltage.

FIG. 5d shows that if the analog signal is equal to ½ of the reference voltage, as mentioned above, the frequency of the output signal Q' is exactly one-half that of the clock signal T, or in other words, that per two clock periods, two polarity reversals of the output signal Q' occur.

By contrast, FIG. 5g shows that if the amplitude of the analog signal differs from the case of FIG. 5d—here, the analog signal is equal to ¾ of the reference voltage —, the frequency of the output signal Q' is less than in the case of FIG. 5d—only one-quarter of the frequency of the clock signal T—, or in other words, that two polarity reversals of the output signal Q' occur only every four clock periods. The frequency of the polarity reversals has thus decreased from that of FIG. 5d.

The waveforms of FIGS. 5b and 5c as well as 5e and 5f follow from those of FIG. 5d and 5g, respectively, and from the respective basic functions of the comparator and integrator. In FIG. 5c, the capacitor of the integrator is charged and discharged at the same rate. In FIG. 5f, the charging of the capacitor takes three times as long as its discharge. Since the signal K' is developed only during the positive portions of the signal J', the frequency of the pulses K' of FIG. 5e is substantially less than that of the pulses K' of FIG. 5b.

The seven graphs a) to g) of FIG. 6 are the waveforms of the following signals of the circuit of FIG. 2:
a) clock signal T' for a divisor n of the frequency divider 16 of 4;
b) and e): output signal K of the comparator 12;
c) and f): output signal J of the integrator 11;
d) and g): output signal Q of the D flip-flop 14'.
The following holds
for b) to d): analog signal U equal to ½ of the reference voltage Uu, and
for e) to g): analog signal U equal to ¾ of the reference voltage Uu.

FIG. 6b shows that if the analog signal U is equal to ½ of the reference voltage Uu, the frequency of the output signal K is again exactly one-half that of the clock signal T', but that because of the pulse-width selector 13, as shown in FIG. 6d, the signal Q at the output of the D flip-flop 14' consists of pairs of pulses, namely of a wide pulse and a narrow pulse. Since n=4, the width of a narrow pulse is equal to the period of the clock signal T, while that of the wide pulse is (n−1) times, i.e., three times, that period.

The narrow pulses cause the reversals of the charging/discharging process of the capacitor C of the integrator 11, which lie in the negative region and can be seen in FIG. 6c as small, upwardly directed jags. Every two periods of the additional clock signal T', four polarity reversals of the output signal Q' thus occur in FIG. 6d (instead of two in FIG. 5d), but the frequency of T' is only one-quarter the frequency of T, so that the frequency of the polarity reversals is reduced by the divisor 4, i.e., generally by n.

FIGS. 6e through 6g show that if the amplitude of the signal U differs from the case of FIG. 6b —in this concrete case, the analog signal U is equal to ¾ of the reference voltage Uu —, the frequency of the output signal Q' does not change from that of FIG. 6g, but that only the number of wide and narrow pulses in the output signal Q of FIG. 6g changes within four periods of the clock signal T'. While two wide and two narrow pulses occur in FIG. 6d, there are one wide and three narrow pulses in FIG. 6g. Thus, in the invention, the number of polarity reversals, in addition to being greatly reduced by n as mentioned above, remains constant over the amplitude range of the analog signal U.

As the number of narrow pulses is greater than in FIG. 6d, a correspondingly greater number of reversals of the charging/discharging process of the capacitor C of the integrator 11, which can be seen as small, upwardly directed jags, appear in the output signal J of FIG. 6f, namely, according to the number of narrow pulses, (n−1)=3 per four periods of the additional clock signal T'.

I claim:

1. A delta-sigma analog-to-digital converter comprising
an integrator whose signal input is supplied through an integrating resistor with an analog signal to be converted,
a comparator having its comparator input connected to the output of the integrator and its reference input grounded,
a pulse-width selector
which provides a narrow or wide pulse depending on the level of the comparator output signal,
whose signal input is connected to the output of the comparator, and
whose first clock input is supplied with a clock signal, and whose second clock input is supplied with an additional clock signal derived from said clock signal by frequency division (divisor n>3), and a series combination of a first and a second electronic switch.
which is connected either between a unipolar reference voltage and ground or between the two terminals for a bipolar, balanced-to-ground reference voltage,
in which the control inputs of the first and second electronic switches are connected to the noninverted and inverted outputs, respectively, of the pulse-width selector, and
in which the junction of the electronic switches is connected to a further-processing arrangement and through a feedback-resistor to the signal input of the integrator,
wherein a reference input of the integrator is, in the case of the unipolar reference voltage, fed with that portion of this voltage which is equal to (Ri/(Ri+Rk)) Uu/2, or, in the case of the bipolar reference voltage, connected to ground, and
wherein the width of narrow pulse provided by the pulse-width selector is equal to the period of the clock signal, while the width of the wide pulse provided by the pulse-width selector is equal to (n−1) times the period of the clock signal, Ri and Rk being the values of said integrating resistor and said feedback resistor, respectively, and Uu being the value of said reference voltage.

2. A delta-sigma analog-to-digital converter comprising
an integrator whose signal input is supplied through an integrating resistor with an analog signal to be converted,
a comparator having its comparator input connected to the output of the integrator and its reference input grounded,
a pulse-width selector
which provides a narrow or wide pulse depending on the level of the comparator output signal,
whose signal input is connected to the output of the comparator, and
whose first clock input is supplied with a clock signal, and whose second clock input is supplied with an additional clock signal derived from said clock signal by frequency division (divisor n>3), and
a D flip-flop
whose D input is connected to the output of the pulse-width selector,
whose noninverted output is coupled through a feedback resistor to the input of the integrator,
whose clock input is supplied with the additional clock signal, whose inverted output is coupled to a further-processing arrangement, and whose operating voltage is either a unipolar reference voltage or a bipolar reference voltage balanced with respect to ground, wherein a reference input of the integrator is, in the case of the unipolar reference voltage, fed with that portion of this voltage which is equal to $(R_i/(R_i+R_k)) U_u/2$, or, in the case of the bipolar reference voltage, connected to ground, and wherein the width of the narrow pulse provided by the pulse-width selector is equal to the period of the clock signal, while the width of the wide pulse provided by the pulse-width selector is equal to $(n-1)$ times the period of the clock signal, $R_i$ and $R_k$ being the values of said integrating resistor and said feedback resistor, respectively, and $U_u$ being the value of said reference voltage.

3. A delta-sigma analog-to-digital converter as claimed in claim 2 wherein the divisor n is a power of two.

* * * * *